United States Patent [19]

Hiramoto et al.

[11] Patent Number: 4,547,455

[45] Date of Patent: Oct. 15, 1985

[54] PROCESS OF FORMING POLYIMIDE PATTERN AND DEVELOPER THEREFOR

[75] Inventors: Hiroo Hiramoto, Ohtsu; Masuichi Eguchi, Kyoto, both of Japan

[73] Assignee: Toray Industries, Inc., Tokyo, Japan

[21] Appl. No.: 505,206

[22] Filed: Jun. 17, 1983

[30] Foreign Application Priority Data

Jun. 22, 1982 [JP] Japan .................................. 57-107180

[51] Int. Cl.$^4$ ........................ G03C 5/16; G03C 1/70
[52] U.S. Cl. ................................ 430/325; 430/197; 430/195; 430/283; 430/287; 430/330; 430/331; 430/281
[58] Field of Search ............... 430/331, 330, 197, 195, 430/325, 283, 287, 281

[56] References Cited

U.S. PATENT DOCUMENTS

| | | | |
|---|---|---|---|
| 3,957,512 | 5/1976 | Kleeberg et al. | 430/325 |
| 4,040,831 | 8/1977 | Rubner et al. | 430/330 |
| 4,093,461 | 6/1978 | Loprest et al. | 430/330 |
| 4,093,465 | 6/1978 | Chu et al. | 430/280 |
| 4,243,743 | 1/1981 | Hiramoto et al. | 430/330 |
| 4,310,641 | 1/1982 | Ohmura et al. | 430/283 |
| 4,321,319 | 3/1982 | Shoji et al. | 430/283 |
| 4,329,419 | 5/1982 | Goff et al. | 430/283 |
| 4,332,883 | 6/1982 | Ahne et al. | 430/325 |
| 4,403,029 | 9/1983 | Ward, Jr. et al. | 430/331 |
| 4,451,551 | 5/1984 | Kataoka et al. | 430/197 |

OTHER PUBLICATIONS

Ibert Mellan, *Industrial Solvents Handbook 1970*, Noyes Data Corporation, Park Ridge, N.J., 1970, pp. 293–303, 320–321.

*Primary Examiner*—John Kittle
*Assistant Examiner*—Cynthia Hamilton
*Attorney, Agent, or Firm*—Austin R. Miller

[57] ABSTRACT

A process of forming a polyimide pattern on a base plate, which comprises exposing imagewise a layer of photosensitive polyimide precursor on the base plate, removing unexposed areas by developing and curing the resultant pattern of the polyimide precursor, characterized by employing a developer containing (A) at least one solvent selected from the group consisting of N,N-dimethylacetamide, N-methyl-2-pyrrolidone, N,N-dimethylformamide, dimethylsulfoxide and γ-butyrolactone, (B) methanol and (C) at least one solvent represented by the formula;

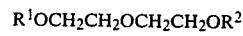

$$R^1OCH_2CH_2OCH_2CH_2OR^2$$

wherein $R^1$ is a hydrogen atom or $R^2$ and $R^2$ is an alkyl group having 1 to 4 carbon atoms.

28 Claims, No Drawings

PROCESS OF FORMING POLYIMIDE PATTERN AND DEVELOPER THEREFOR

This invention relates to a process of forming a polyimide pattern on a base plate. More particularly, the present invention relates to a new and more practical developer employable in the process. According to the invention, a polyimide pattern of high quality is easily obtainable by using the developer notwithstanding the thickness of the layer of photosensitive polyimide precursor.

The polyimide pattern on the base plate is usually formed by exposing imagewise a layer of photosensitive polyimide precursor on the base plate, the polyimide precursor being curable into polyimide by heating, removing unexposed areas of the photosensitive layer by developing and heating or thermally curing the polyimide precursor in the layer to convert the resultant polyimide precursor pattern to a polyimide pattern.

Conventionally, a solvent of N-methyl-2-pyrrolidone (NMP), N,N-dimethylacetamide (DMAc), γ-butyrolactone (γ-BL), N,N-dimethylformamide (DMF), etc., which are a good solvent of polyimide precursor, or a mixed solvent of such solvent with toluene, ethanol or methanol are well known as a developer employed in the process of forming the polyimide pattern. Since every one of these developers contains the good solvent for polyimide precursor as a main component, it has a strong affinity not only to the unexposed photosensitive polyimide precursor but also to the exposed photosensitive polyimide precursor which has been offered a cross-linked structure by exposing to actinic radiation.

Accordingly, during the developing operation, the dissolution of the exposed areas of the photosensitive layer which should primarily be insoluble to the developer proceeds and the thickness thereof is reduced remarkably. In the case that the thickness of the photosensitive layer coated on the base plate is relatively thick such as more than 3 μm, the strict control of the developing time is indispensable to obtain a developed layer of relatively uniform in thickness. On the other hand, in the case that the thickness of the photosensitive layer is relatively thin such as less than 3 μm, it is very difficult to develop the photosensitive layer imagewise. Especially, when the photosensitive layer is thinner than 1 μm, it is almost impossible to remove only the unexposed areas since the exposed areas are also dissolved into the developer within some seconds.

As mentioned above, the conventional developer has defects that the strict control of the developing time is required to the relatively thick layer of photosensitive polyimide precursor and that it is difficult to accurately develop the image pattern in the relatively thin layer of photosensitive polyimide precursor.

The object of the present invention is to delete such defects of the prior art and to provide a process of forming a polyimide pattern wherein the control of the developing operation is simple for the relatively thick layer of photosensitive polyimide precursor and the development of accurate image pattern is possible even in the relatively thin layer of photosensitive polyimide precursor.

The other object of the invention is to provide an improved developer efficiently employable in the process above-mentioned.

Another objects of the invention will be apparent from the description hereinafter.

According to the invention, in a process of forming a polyimide pattern on a base plate, which comprises the following Steps:

(1) providing to the base plate a layer of photosensitive polyimide precursor which is curable into polyimide by heating, (2) placing a photomask on the photosensitive layer and exposing the layer imagewise to actinic radiation through the photomask to form an image pattern of polyimide precursor in the layer, (3) removing the unexposed areas of the layer with the developer, (4) curing the resultant polyimide precursor pattern by heating to convert it to the polyimide pattern, the improvement is to employ a developer containing;

(A) at least one solvent selected from the group consisting of N,N-dimethylacetamide (DMAc), N-methyl-2-pyrrolidone (NMP), N,N-dimethylformamide (DMF), dimethylsulfoxide (DMSO) and γ-butyrolactone (γ-BL), (B) methanol, and (C) at least one solvent represented by the formula;

$$R^1OCH_2CH_2OCH_2CH_2OR^2 \qquad (I)$$

wherein $R^1$ is a hydrogen atom or $R^2$ and $R^2$ is an alkyl group having 1 to 4 carbon atoms.

The solvent of the formula (I) includes, for instance, diethylene glycol monomethyl ether, diethylene glycol dimethyl ether, diethylene glycol monoethyl ether, diethylene glycol diethyl ether, diethylene glycol monobutyl ether and diethylene glycol dibutyl ether.

The developer according to the present invention comprises one or more solvents of group (A) mentioned above, methanol and one or more solvents of group (C). The weight ratio of the solvent of group (A) to methanol is preferably 4/6 to 9/1. If the weight ratio is over 9/1, the developed layer of polyimide precursor is apt to have cracks, and on the other hand, if the weight ratio is below 4/6, the unexposed area of the layer which should be dissolved out in the developing step is apt to remain in the layer.

The developer of the invention contains 80 to 10% by weight, preferably 80 to 40% by weight of the total amount of components (A) and (B) and 20 to 90% by weight, preferably 20 to 60% by weight of component (C). In a specific case where the solvent of component (C) is diethylene glycol monomethyl ether, the solvent is particularly preferable to be contained in an amount of 50 to 80% by weight of the developer. In addition, in the case where the solvent of component (C) is diethylene glycol dimethyl ether, diethylene glycol monoethyl ether, diethylene glycol diethyl ether, diethylene glycol monobutyl ether and diethylene glycol dibutyl ether, the solvent is particularly preferable to be contained in an amount of 30 to 50, 30 to 60, 20 to 40, 20 to 40 and 20 to 40% by weight of the developer, respectively. When the content of the solvent of component (C) is over the upper limit of each range above-mentioned, the transparency of the developed layer is apt to be damaged and it is difficult to obtain a uniform layer. On the other hand, when the content of the solvent of component (C) is below the lower limit of each range above-mentioned, it is difficult to control the developing operation for getting a satisfactory and excellent image pattern in the relatively thin layer of photosensitive polyimide precursor.

In addition to the three kinds of solvents (A), (B) and (C) above-mentioned, other solvent(s) may be contained in the developer of the invention unless an adverse influence is effected on the development. As unrestricted examples of such a solvent, alcohols such as ethanol and isopropyl alcohol, derivatives of ethylene glycol, esters, hydrocarbons, ethers, etc. may be mentioned.

The photosensitive polyimide precursor used in the present invention is given the sensitivity to the actinic radiation such as ultraviolet rays, far ultraviolet rays and visible rays by introducing an organic photosensitive group into the polyimide precursor, for instance the side chain thereof, or by mixing a photosensitive compound with the polyimide precursor. Such a photosensitive polyimide precursor is known in the subject field of the art and known photosensitive polyimide precursor may be coated on the base plate in the present invention.

The polyimide precursor is also known in the conventional process of forming the polyimide pattern, which is convertible to the polyimide by heating or thermally curing. The typical example of the polyimide precursor is polyamide acid. By the heat-treatment the imide rings are formed in the polymer. The typical heat-treatment is carried out at 135° C., 200° C., 350° C. and 400° C. and continued for 30 min in each temperature.

The photosensitive group above-mentioned includes those which are dimerized or polymerized by the light to form cross-linkages between the polyimide precursors, those which are activated to radicals or ions by the light, by which radicals or ions the polyimide precursors being cross-linked therebetween, and those which are activated by the light and reacted with the polyimide precursors to reduce the solubility thereof, etc. As such a photosensitive group, a group having carbon-carbon double bond which is dimerizable or polymerizable by the light, an azide group and an quinone diazide group are exemplified.

The photosensitive compound which can be mixed with the polyimide precursor has the photosensitive group mentioned above. As such a photosensitive compound, vinyl compounds having an amino group, bis-azide compounds and naphthoquinone diazide compounds are exemplified.

The followings are the typical example of the photosensitive polyimide precursor.

(i) A mixture of a polyimide precursor represented by the formula (II) and a compound having the photosensitive group and amino group;

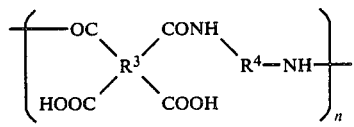

wherein n is an integer and $R^3$ and $R^4$ are tetravalent and bivalent aromatic group, respectively.

The photosensitive group herein mentioned is the same as defined above. As the compound having the photosensitive group and amino group, allylamine, vinylpyridine, dimethylaminoethyl methacrylate, diethylaminoethyl methacrylate, dimethylaminoethyl acrylate, diethylaminoethyl acrylate, diallylamine, a compound having the azide group and amino group, a compound having diazide group and amino group, etc. may be mentioned.

The group $R^3$ in the formula (II) includes, for instance, a phenyl, benzophenonyl, naphthyl and biphenyl group. The group $R^4$ includes, for instance, phenoxyphenyl, phenylsulfonylphenyl, benzylphenyl and phenyl group.

This exemplified mixture is disclosed in Japanese Pat. Laying Open Nos. 145794/79, 24344/81, 162926/82 and 168942/82, etc.

(ii) A polyimide precursor represented by the formula (III);

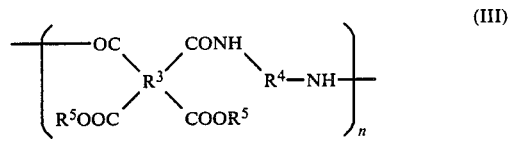

wherein $R^3$, $R^4$ and n are defined as above, respectively and $R^5$ is an organic group having a functional group dimerizable or polymerizable by the light.

The group $R^5$ includes, for instance, allyl group, methallyl group and various acyloylalkylenyl groups represented by the following formulas.

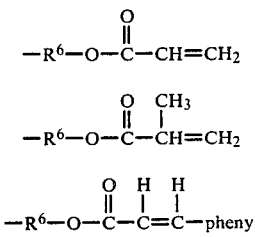

wherein $R^6$ is a bivalent alkylene group of 2 or 3 carbon atoms.

This polyimide precursor is disclosed in Japanese Pat. Laying Open Nos. 115541/74, 40920/76, 40921/76 and 40922/76.

(iii) A polyimide precursor represented by the formula (IV);

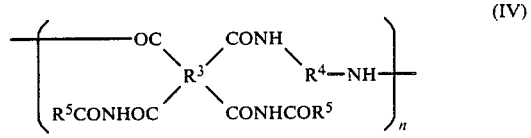

wherein $R^3$, $R^4$, $R^5$ and n are defined as above, respectively.

This polyimide precursor is disclosed in Japanese Pat. Laying Open No. 116216/79.

(iv) A mixture of the polyimide precursor represented by the formula (II) and bis-azide.

This mixture is disclosed in Japanese Pat. Laying Open No. 127723/78.

(v) A mixture of the polyimide precursor represented by the formula (II) and naphthoquinone diazide.

This mixture is disclosed in Japanese Pat. Laying Open No. 13315/77.

According to the present invention, the mixture of the polyimide represented by the formula (II) and a compound having the photosensitive group and amino group, which is belonging to type (i), is most preferable among others.

The photosensitive layer of the invention may contain one or more photosensitizers such as Michler's ketone, benzoin ether, 2-t-butyl-9,10-anthraquinone, 4,4'-bis(diethylamino)benzophenone, bis-azide compound, monoazide compound and sulfonazide compound. Further, the photosensitive polyimide precursor may contain a comonomer which is copolymerizable to the polyimide or the precursor thereof. The preferable comonomer is monomaleimide, polymaleimide or a substitution product thereof.

The photosensitive polyimide precursor is usually coated on the base plate in the form of solution after dissolved in a suitable solvent.

The proceedings for the formation of polyimide pattern will be described hereinafter.

Firstly, a solution of photosensitive polyimide precursor is coated on the base plate, for example, by a spinner and then dried to form the layer of photosensitive polyimide precursor on the base plate.

An image-bearing photomask is put on the photosensitive layer, and then the actinic light from, for example, a high pressure mercury lamp is irradiated to the layer through the photomask. The preferable photomask is a chromium mask bearing a image pattern of chromium or chromium oxide on a glass or a emulsion mask bearing the image pattern of photographic emulsion on the glass or a transparent film.

After the exposure, the mask is removed and the exposed photosensitive layer is developed with the developer comprising (A) one or more solvents selected form the group consisting of N,N-dimethylacetamide (DMAc), N-methyl-2-pyrrolidone (NMP), N,N-dimethylformamide(DMF), dimethylsulfoxide (DMSO) and γ-butyrolactone (γ-BL), (B) methanol and (C) one or more solvents represented by the formula:

$$R^1OCH_2CH_2OCH_2CH_2OR^2$$

wherein $R^1$ is a hydrogen atom or $R^2$ and $R^2$ is an alkyl group having 1 to 4 carbon atoms.

The developing operation may be carried out by the immersion with or without irradiating a ultrasonic wave or the spraying of the developer. After the development, it is preferable to rinse the developed layer with a rinsing liquid. The rinsing may be carried out by the immersion or the spraying as in the conventional photoresist. The ultrasonic wave may be irradiated during the rinsing. One of examples of the rinsing liquid is isopropyl alcohol.

The thus obtained image pattern of the polyimide precursor is then subjected to the heat-treatment to convert it into the polyimide pattern.

The heat-treatment may be divided into two steps; one is a heat-treatment at relatively low temperature mainly for removing the solvent in the developed layer and the other is a heat-treatment at relatively high temperature for removing the photosensitive component and for completing the imidizing reaction of the polyimide precursor. The heat-treatment at relatively low temperature is preferably carried out within the temperature of 70° to 200° C. for about 10 to 60 min. The actual temperature may be one stage or multi-stage or continuously raised within the temperature range mentioned above. In the step of the heat-treatment at relatively low temperature, both the removal of solvent and the closure of imide rings proceed at the same time. When the closure of imide rings proceeds more rapidly than the removal of solvent, the polyimide occasionally deposits in the layer by phase separation and the transparency of the layer is damaged. The temperature and the time in the heat-treatment at relatively low temperature may be optionally chosen in the range of maintaining the transparency of the layer. The heat-treatment of relatively high temperature is carried out within the temperature of 250° to 450° C., preferably 300° to 400° C. for about 10 to 60 min. The main purpose of the heat-treatment at relatively high temperature is to complete the closure of imide rings, and the actual conditions therefor is changeable according to the use of polyimide pattern finally obtained and may be fixed while depending on the use. The temperature chosen in the heat-treatment at relatively high temperature may also be one stage or multi-stage or continuously raised within the range above-mentioned. Another heat-treatment may be allowable between the heat-treatments of relatively low and high temperatures, for instance, in the temperature range of 200° to 300° C. The conditions of the preferable heat-treatment are the multi-stage temperature of 135° C., 200° C., 300° C. and 400° C. and the time of 30 min at each temperature. Alternatively, the first heating is at 135° C. for 30 min and then the temperature is continuously raised to 400° C. in the next 90 min followed by heating at 400° C. for 15 min.

The atmosphere of the heat-treatment is air, nitrogen, vacuum, etc. The heat-treatment may be carried out in an inert gas such as helium and others. The heating on a hot plate or in an oven ventilated with hot gaseous stream is preferably employed.

As described hereinbefore, the present invention provides the process for forming the polyimide pattern with using the developer containing one or more solvents of group (A), methanol and one or more solvents of group (C). According to the process of this invention, the control of the developing operation for getting a satisfactory and excellent polyimide pattern becomes easy and simple remarkably. Particularly, in case of developing the thin exposed photosensitive layer of less than 1 μm in thickness, the developer of the present invention can reproduce the image pattern in the layer, while the conventional developer dissolves even the exposed areas of the layer in a relatively short time and can't reproduce the satisfactory pattern in the layer.

The polyimide pattern obtained by this invention has a broad use, for instance, an insulator or a protective coating for the multi-layered semiconductor integrated circuits or other electronic components.

The invention will be further illustrated in and by, but in no way limited, the following examples.

EXAMPLE 1

A silicon wafer was coated with a solution of photosensitive polyimide precursor (Photoneece ® UR3160, manufactured by Toray Industries, Inc.) by a spinner under the conditions of 3000 rpm for 30 sec in a room temperature of 25° C. Then the coated silicon wafer was dried at 80° C. for 60 min to form a layer of the photosensitive polyimide precursor on the silicon base plate. The layer has a thickness of 0.6 μm.

After placing an image-bearing chromium mask on the photosensitive layer, the layer was exposed to a light radiated by a ultra-high pressure mercury lamp. The total exposure energy was 250 mJ/cm² at 365 nm.

A polyethylene beaker was set in a washing vessel of an ultrasonic washing machine manufactured by Branson Co., and water was introduced between the vessel and the beaker. The beaker was filled with 500 ml of a developer containing 20% by weight of DMAc, 10% by weight of methanol and 70% by weight of diethylene glycol monomethyl ether. After adjusting the temperature of the developer to 25° C., the ultrasonic wave was generated. The exposed silicon base plate was immersed into the developer so that the coated surface thereof faced to the oscillator of the ultrasonic wave and kept to remain stationary for 60 sec.

Thereafter, the silicon base plate was rinsed for 15 sec in isopropyl alcohol. Immediately after taking out the base plate from the rinsing liquid, the base plate was dried by blowing a gaseous nitrogen stream and then subjected to a series of heat-treatment at 135° C., 200° C., 300° C. and 400° C. Each heat-treatment was continued for 30 min.

The resultant polyimide pattern was satisfactory and excellent.

The thickness of the polyimide layer was 0.1 μm.

EXAMPLE 2

A silicon wafer was coated with a solution of photosensitive polyimide precursor (Photoneece ® UR 3100, manufactured by Toray Industries, Inc.) by a spinner under the conditions of 7000 rpm for 30 sec in a room temperature of 25° C. Then the coated silicon wafer was dried at 80° C. for 60 min to form a layer of the photosensitive polyimide precursor on the silicon base plate. The layer has a thickness of 1.2 μm.

After placing an image-bearing chromium mask on the photosensitive layer, the layer was exposed to a light radiated by an ultra-high pressure mercury lamp. The total exposure energy was 250 mJ/cm$^2$ at 365 nm.

The thus exposed layer of polyimide precursor on the silicon base plate was developed as in Example 1 by using as the developer a mixed solvent of 30% by weight of NMP, 20% by weight of methanol and 50% by weight of diethylene glycol dimethyl ether. After rinsing and thermally curing as in Example 1, obtained was a satisfactory and excellent polyimide pattern. The thickness of the final polyimide layer was 0.5 μm.

Example 2 was repeated while elongating the developing time to 120 sec, and there was found no difference in the developing quality between the developing times of 60 sec and 120 sec.

EXAMPLE 3

The same procedures of forming a polyimide pattern as those in Example 2 were carried out except for using a developer of 25% by weight of DMF, 25% by weight of methanol and 50% by weight of diethylene glycol monoethyl ether.

The obtained polyimide layer on a base plate was 0.5 μm in thickness after the heat-treatment and the polyimide pattern was also excellent.

EXAMPLE 4

The same procedures of forming a polyimide pattern as those in Example 2 were carried out except for using a developer of 30% by weight of DMSO, 30% by weight of methanol and 40% by weight of diethylene glycol monobutyl ether.

The obtained polyimide layer on a base plate was 0.5 μm in thickness after the heat-treatment and the polyimide pattern was also excellent.

EXAMPLE 5

A diamine solution was prepared by dissolving 110 g of diaminodiphenyl ether in 278 g of N-methyl-2-pyrrolidone. An acid solution was prepared by dispersing 120 g of pyromellitic anhydride in 308 g of dimethylacetamide followed by adding 184 g of N-methyl-2-pyrrolidone. The acid solution was added to the diamine solution of the temperature of 60° C. and the mixture was brought into reaction for 3 hours to obtain a solution of polyimide precursor, the viscosity of which was 60 poise at 30° C.

The thus obtained solution of polyimide precursor in an amount of 50 g was added to a mixture of a solution of 1.15 g of Michler's ketone in 30 g of dimethylacetamide and a solution of 10.2 g of diethylaminoethyl methacrylate in 100 g of dimethylacetamide. After filtration, a solution of photosensitive polyimide precursor according to the invention was obtained.

The solution of photosensitive polyimide precursor was coated on a base plate of silicon wafer by a spinner and dried at 80° C. for 60 min. The obtained photosensitive layer has a thickness of 0.4 μm.

The photosensitive layer on the base plate was exposed, developed, rinsed, dried and thermally cured as in Example 1.

The obtained polyimide pattern was satisfactory and excellent. The thickness of the polyimide layer was 0.1 μm after the heat-treatment.

EXAMPLE 6

Into 50 g of the polyimide precursor solution of Example 5, a solution of 1.15 g of Michler's ketone in 30 g of dimethylacetamide and a solution of 10.2 g of diethylaminoethyl methacrylate in 100 g of dimethylacetamide was added and mixed. To this mixed solution, 1.15 g of phenylmaleimide was added and dissolved. After filtration, there was obtained a solution of photosensitive polyimide precursor according to the invention.

The thus obtained photosensitive solution was coated on the base plate of silicon wafer and dried at 80° C. for 60 min. The obtained photosensitive layer has a thickness of 0.4 μm.

The exposing, developing and thermally curing steps in Example 1 were carried out provided that the employed developer contained 30% by weight of DMAc, 20% by weight of methanol and 50% by weight of diethylene glycol monomethyl ether and the developing time was shortened to 40 sec.

The resultant polyimide pattern was satisfactory and excellent and the thickness of the polyimide layer was 0.1 μm after the thermal curing.

COMPARATIVE EXAMPLE 1

The procedures of Example 1 were repeated except for using a developer containing 60% by weight of DMAc and 40% by weight of methanol. However, the exposed area of the layer of polyimide precursor in addition to the unexposed area thereof was completely dissolved out in the step of developing, and accordingly, no polyimide pattern could be obtained.

In another trial, the time of developing was shortened to 2 sec, however, also in this case, the exposed area was wholly dissolved and accordingly, no pattern could be obtained.

COMPARATIVE EXAMPLE 2

The procedures of Example 2 were repeated except for using a developer containing 60% by weight of NMP and 40% by weight of methanol.

However, a satisfactory polyimide pattern could not be obtained since the thickness of the exposed area of the polyimide precursor layer was reduced remarkably. The thickness was 0.1 μm after the heat-treatment.

In another trial, the developing time was shortened to 15 sec. The obtained polyimide pattern was satisfactory, but the allowable deviation of the developing time for obtaining a satisfactory polyimide pattern was extremely narrow as ±2 sec and the strict control of the developing time was required.

What is claimed is:

1. A process of forming a polyimide pattern on a base plate, which comprises:
   (1) providing to the base plate a layer of photosensitive polyimide precursor comprising a polyimide precursor and a compound having a photosensitive group and an amino group,
   (2) exposing the layer imagewise to actinic radiation through a photomask to form an exposed image pattern of polyimide precursor in the layer,
   (3) removing unexposed areas of the layer with a developer containing;
      (A) at least one solvent selected from the group consisting of N, N-dimethylacetamide, N-methyl-2-pyrrolidone, N, N-dimethylformamide, dimethylsulfoxide and γ-butyrolactone,
      (B) methanol, and
      (C) at least one solvent represented by the formula:

$$R^1OCH_2CH_2OCH_2CH_2OR^2$$

wherein $R^1$ is a hydrogen atom or the same as $R^2$ and $R^2$ is an alkyl group having 1 to 4 carbon atoms, and
   (4) curing the exposed image pattern of the polyimide precursor in the layer by heating.

2. The process of claim 1, wherein the developer contains 80 to 10% by weight of the total amount of components (A) and (B) and 20 to 90% by weight of component (C).

3. The process of claim 1, wherein the developer contains 80 to 40% by weight of the total amount of components (A) and (B) and 20 to 60% by weight of component (C).

4. The process of claim 1, wherein the component (C) of the developer is selected from the group consisting of diethylene glycol monomethyl ether, diethylene glycol dimethyl ether, diethylene glycol monoethyl ether, diethylene glycol diethyl ether, diethylene glycol monobutyl ether and diethylene glycol dibutyl ether.

5. The process of claim 1, wherein the weight ratio of the component (A) to the component (B) in the developer is in the range of 4/6 to 9/1.

6. The process of claim 1, wherein the solvent of component (C) is diethylene glycol monomethyl ether.

7. The process of claim 6, wherein the content of diethylene glycol monomethyl ether amounts to 50 to 80% by weight of the developer.

8. The process of claim 1, wherein the solvent of component (C) is diethylene glycol dimethyl ether.

9. The process of claim 8, wherein the content of diethylene glycol dimethyl ether amounts to 30 to 50% by weight of the developer.

10. The process of claim 1, wherein the solvent of component (C) is diethylene glycol monoethyl ether.

11. The process of claim 10, wherein the content of diethylene glycol monoethyl ether amounts to 30 to 60% by weight of the developer.

12. The process of claim 1, wherein the solvent of component (C) is diethylene glycol diethyl ether.

13. The process of claim 12, wherein the content of diethylene glycol diethyl ether amounts to 20 to 40% by weight of the developer.

14. The process of claim 1, wherein the solvent of component (C) is diethylene glycol monobutyl ether.

15. The process of claim 14, wherein the content of diethylene glycol monobutyl ether amounts to 20 to 40% by weight of the developer.

16. The process of claim 1, wherein the solvent of component (C) is diethylene glycol dibutyl ether.

17. The process of claim 16, wherein the content of diethylene glycol dibutyl ether amounts to 20 to 40% by weight of the developer.

18. The process of claim 1, wherein the solvent of component (A) is N-methyl-2-pyrrolidone.

19. The process of claim 1, wherein the solvent of component (A) is N, N-dimethylacetamide.

20. The process of claim 1, wherein the photosensitive group is a group having a carbon-carbon double bond which is dimerizable or polymerizable by actinic light.

21. The process of claim 1, wherein the photosensitive group is an azide group or a sulfonazide group.

22. The process of claim 1, wherein the compound having a photosensitive group and an amino group is at least one selected from the group consisting of allylamine, vinyl pyridine, dimethylaminoethyl methacrylate, dimethylaminoethyl methacrylate, dimethylaminoethyl acrylate, dimethylaminoethyl acrylate and diallylamine.

23. The process of claim 1, wherein the compound having a photosensitive group and an amino group is dimethylaminoethyl methacrylate.

24. The process of claim 1, wherein the compound having a photosensitive group and an amino group is diethylaminoethyl methacrylate.

25. The process of claim 1, wherein the compound having a photosensitive group and an amino group is dimethylaminoethyl acrylate.

26. The process of claim 1, wherein the compound having a photosensitive group and an amino group is diethylaminoethyl acrylate.

27. The process of claim 1, wherein the photosensitive layer contains one or more photosensitizers.

28. The process of claim 27, wherein the photosensitizer is selected from the group consisting of Michler's ketone, bis-azide and monoazide.

* * * * *